United States Patent
Lim et al.

(10) Patent No.: US 9,204,535 B2
(45) Date of Patent: Dec. 1, 2015

(54) CONDUCTIVE STRUCTURE AND METHOD FOR MANUFACTURING SAME

(71) Applicant: LG CHEM, LTD., Seoul (KR)

(72) Inventors: Jin Hyong Lim, Seoul (KR); Sujin Kim, Daejeon (KR); Song Ho Jang, Daejeon (KR); Ki-Hwan Kim, Daejeon (KR); Chung Wan Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/351,371

(22) PCT Filed: Apr. 18, 2013

(86) PCT No.: PCT/KR2013/003274
§ 371 (c)(1),
(2) Date: Apr. 11, 2014

(87) PCT Pub. No.: WO2013/157858
PCT Pub. Date: Oct. 24, 2013

(65) Prior Publication Data
US 2014/0251429 A1    Sep. 11, 2014

(30) Foreign Application Priority Data

Apr. 18, 2012  (KR) .................. 10-2012-0040104

(51) Int. Cl.
*G06F 3/044*  (2006.01)
*H05K 1/02*  (2006.01)
(Continued)

(52) U.S. Cl.
CPC ............ *H05K 1/0274* (2013.01); *C23C 14/087* (2013.01); *G06F 3/044* (2013.01); *G06F 3/045* (2013.01); *H01B 1/026* (2013.01);
(Continued)

(58) Field of Classification Search
CPC ..... G06F 3/03547; G06F 3/041; G06F 3/044; G06F 3/045; G06F 3/047
USPC ............................. 428/195.1, 201, 203, 209
See application file for complete search history.

(56) References Cited

U.S. PATENT DOCUMENTS 5,556,694 A    9/1996  Austin
7,666,567 B2*  2/2010  Gao et al. .................. 430/200
(Continued)

FOREIGN PATENT DOCUMENTS

CN    102243548 A    11/2011
JP    2008541200 A    11/2008
(Continued)

OTHER PUBLICATIONS

Refractive index and extinction coefficient spectrum of CuO obtained from http://refractiveindex.info/ on Aug. 19, 2014.*
(Continued)

*Primary Examiner* — Gerard Higgins
(74) *Attorney, Agent, or Firm* — Dentons US LLP

(57) ABSTRACT

Provided is a conductive structure body comprising: a substrate; a conductive pattern; and a darkened pattern comprising $CuO_x$ ($0<x\leq 1$), and a method for manufacturing the same. The conductive structure body may prevent reflection due to a conductive pattern without affecting the conductivity of the conductive pattern, and may improve the concealment of the conductive pattern by improving the absorbance of the conductive structure body. Therefore, a display panel with improved visibility may be developed using the conductive structure body.

22 Claims, 4 Drawing Sheets

(51) Int. Cl.

| | | |
|---|---|---|
| *H01L 31/0224* | (2006.01) | |
| *H01B 1/02* | (2006.01) | |
| *H01L 31/0216* | (2014.01) | |
| *H05K 3/10* | (2006.01) | |
| *G06F 3/045* | (2006.01) | |
| *C23C 14/08* | (2006.01) | |
| *H01L 51/44* | (2006.01) | |

(52) U.S. Cl.
CPC .. *H01L31/02168* (2013.01); *H01L 31/022466* (2013.01); *H01L 31/022491* (2013.01); *H05K 3/10* (2013.01); *G06F 2203/04103* (2013.01); *H01L 51/442* (2013.01); *Y02E 10/50* (2013.01); *Y10T 428/24802* (2015.01); *Y10T 428/24851* (2015.01)

(56) References Cited

U.S. PATENT DOCUMENTS

| | | | |
|---|---|---|---|
| 7,666,568 B2 * | 2/2010 | Gao et al. | 430/200 |
| 2006/0226003 A1 * | 10/2006 | Mize et al. | 204/298.01 |
| 2008/0160263 A1 | 7/2008 | Cho et al. | |
| 2008/0268209 A1 | 10/2008 | Woo et al. | |
| 2009/0059346 A1 | 3/2009 | Xu | |
| 2010/0079387 A1 * | 4/2010 | Rosenblatt et al. | 345/173 |
| 2011/0168432 A1 | 7/2011 | Chun et al. | |
| 2011/0279398 A1 | 11/2011 | Philipp | |
| 2011/0279403 A1 | 11/2011 | Lee et al. | |

FOREIGN PATENT DOCUMENTS

| | | |
|---|---|---|
| KR | 1020080095958 A | 10/2008 |
| KR | 1020100059907 A | 6/2010 |
| KR | 1020110126528 A | 11/2011 |
| TW | 201211854 A1 | 3/2012 |

OTHER PUBLICATIONS

"Structural and optical properties of copper- and nickel-oxynitride films", RWTH Aachen University, 1-23 Fahri Uslu.

* cited by examiner

<Example 1>

<Example 2>

CONDUCTIVE STRUCTURE AND METHOD FOR MANUFACTURING SAME

This application is a 35 USC §371 National Stage entry of International Application No. PCT/KR2013/003274, filed on Apr. 18, 2013, which claims priority of Korean Application No. 10-2012-0040104, filed on Apr. 18, 2012, all of which are hereby incorporated by reference in their entirety.

TECHNICAL FIELD

The present specification relates to a conductive structure body and a method for manufacturing the same.

BACKGROUND ART

In general, a touch screen panel may be classified as follows depending on a detection mode of signals. There are a resistive type that senses a position, which is pressed down by pressure, through a change in current or voltage value in a state where a direct current voltage is applied thereto, a capacitive type that uses capacitance coupling in a state where an alternating current voltage is applied thereto, an electromagnetic type that senses a selected position by a change in voltage in a state where a magnetic field is applied thereto, and the like.

Recently, as the need for a large-area touch screen panel increases, there is a need for developing a technology that may implement a large touch screen panel having excellent visibility while reducing the resistance of an electrode.

DETAILED DESCRIPTION OF THE INVENTION

Technical Problem

In the art to which the present invention pertains, there is a need for developing a technology for improving the performance of touch screen panels of various types.

Technical Solution

An exemplary embodiment of the present invention provides a conductive structure body comprising: a substrate; a conductive pattern provided on the substrate; and a darkened pattern provided on at least one surface of the conductive pattern and comprising $CuO_x$ ($0 < x \leq 1$), in which the conductive pattern has a line width of 10 μm or less, the darkened pattern has a thickness from 20 nm to 60 nm, and the conductive structure body has an average refractive index from 2 to 3 and an average extinction coefficient (k) from 0.2 to 1.5 in a visible light region.

Further, another exemplary embodiment of the present invention provides a method for manufacturing a conductive structure body, the method comprising:

forming a conductive pattern having a line width of 10 μm or less on a substrate; and forming a darkened pattern comprising $CuO_x$ ($0 < x \leq 1$) in a thickness from 20 nm to 60 nm before, after, or before and after the conductive pattern is formed, in which the conductive structure body has an average refractive index from 2 to 3 and an average extinction coefficient (k) from 0.2 to 1.5 in a visible light region.

In addition, another exemplary embodiment of the present invention provides a method for manufacturing a conductive structure body, the method comprising:

forming a conductive layer on a substrate;

forming a darkened layer comprising $CuO_x$ ($0 < x \leq 1$) in a thickness from 20 nm to 60 nm before, after, or before and after the conductive layer is formed; and forming a conductive pattern and a darkened pattern, which have a line width of 10 μm or less, by patterning the conductive layer and the darkened layer separately or simultaneously, in which the conductive structure body has an average refractive index from 2 to 3 and an average extinction coefficient (k) from 0.2 to 1.5 in a visible light region.

Another exemplary embodiment of the present invention provides a touch screen panel comprising the conductive structure body.

Another exemplary embodiment of the present invention provides a display device comprising the conductive structure body.

Another exemplary embodiment of the present invention provides a solar cell comprising the conductive structure body.

Advantageous Effects

The conductive structure body according to an exemplary embodiment of the present invention may prevent reflection due to a conductive pattern without affecting the conductivity of the conductive pattern, and may improve the concealment of the conductive pattern by improving the absorbance of the conductive structure body. Furthermore, it is possible to develop a touch screen panel having improved visibility, and a display device and a solar cell, which comprise the same, using the conductive structure body according to an exemplary embodiment of the present invention.

DESCRIPTION OF MAIN PARTS OF DRAWINGS

Figure 1:
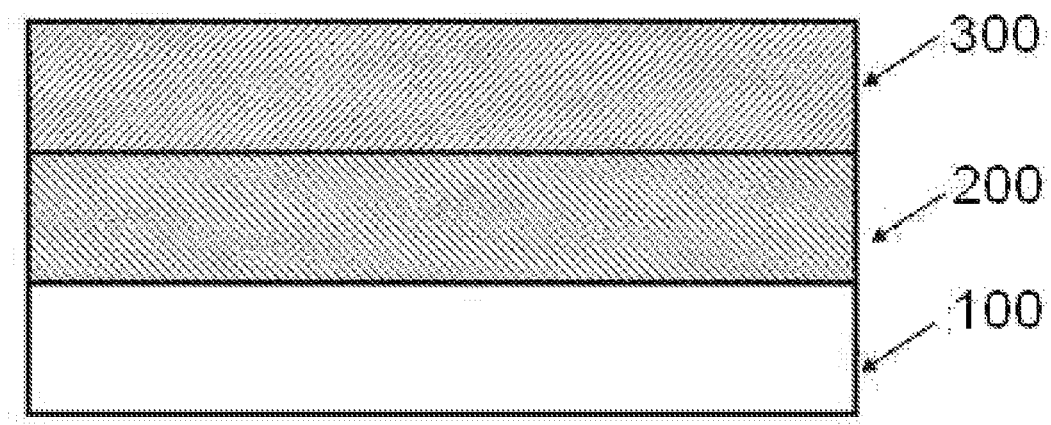
FIGS. 1 to 3 are each an exemplary embodiment of the present invention, and views illustrating a laminate structure of a conductive structure body comprising a darkened pattern.

100: Substrate
200: Darkened pattern
220: Darkened pattern
300: Conductive pattern

[Best Mode]

Hereinafter, the present invention will be described in more detail.

In the present specification, a display device collectively refers to a TV, a computer monitor or the like, and comprises a display element that forms an image, and a casing that supports the display element.

Examples of the display element comprise a plasma display panel (PDP), a liquid crystal display (LCD), an electrophoretic display, a cathode-ray tube (CRT), an OLED display, and the like. The display element may comprise an RGB pixel pattern for implementing an image and an additional optical filter.

Meanwhile, in relation to the display device, as the wide use spread of smart phones, tablet PCs, IPTVs, and the like is accelerating, a need for a touch function in which a human hand is used as a direct input device without needing a separate input device, such as a keyboard, a remote control, or the like, is gradually increasing. Further, a multi-touch function that is capable of recognizing a specific point and writing is also required.

Currently, most of the commercially available touch screen panels (TSPs) are based on a transparent conductive ITO thin film, but due to an RC delay caused by the relatively high sheet resistance (minimum 150Ω/☐, ELECRYSTA manufactured by Nitto Denko Corporation) of an ITO transparent electrode itself when a large-area touch screen panel is applied, there are a problem in that the touch recognition rate is slowed down and an additional compensation chip needs to be introduced in order to overcome the slowed rate, and the like.

The present inventors have studied a technology for replacing the transparent ITO thin film with a metal fine pattern. Thus, the present inventors have found that when Ag, Mo/Al/Mo, MoTi/Cu and the like, which are a metal thin film having high electrical conductivity, are used for an electrode of a touch screen panel, glaring to the eyes and the like may occur due to high reflectance of external light, haze values, and the like along with a problem in that patterns may be visually recognized as well in terms of visibility caused by high reflectance, when a fine electrode pattern with a specific shape is implemented. In addition, the present inventors have found that an expensive target cost may be required during the manufacturing process, or there may be many cases in which the process is complex.

Accordingly, an exemplary embodiment of the present invention has been made in an effort to provide a conductive structure body, which may be differentiated from a touch screen panel in which an ITO-based transparent conductive thin film layer in the related art is used and may be applied to a touch screen panel in which the concealment of a metal fine pattern electrode and reflection and diffraction properties to external light have been improved.

A conductive structure body according to an exemplary embodiment of the present invention comprises: a substrate; a conductive pattern provided on the substrate; and a darkened pattern provided on at least one surface of the conductive pattern and comprising $CuO_x$ ($0<x\leq1$), in which the conductive pattern has a line width of 10 μm or less, the darkened pattern has a thickness from 20 nm to 60 nm, and the conductive structure body has an average refractive index from 2 to 3 and an average extinction coefficient (k) from 0.2 to 1.5 in a visible light region.

Here, the darkened pattern may be provided only on one surface of the conductive pattern, or may be provided on the both surfaces of the conductive pattern.

A conductive structure body according to an exemplary embodiment of the present invention may comprise: a substrate; a darkened pattern provided in a thickness from 20 nm to 60 nm on the substrate and comprising $CuO_x$ ($0<x\leq1$); and a conductive pattern provided on the darkened pattern and having a line width of 10 μm or less.

A conductive structure body according to an exemplary embodiment of the present invention may comprise: a substrate; a darkened pattern provided in a thickness from 20 nm to 60 nm on the substrate and comprising $CuO_x$ ($0<x\leq1$); a conductive pattern provided on the darkened pattern and having a line width of 10 μm or less; and a darkened pattern provided in a thickness from 20 nm to 60 nm on the conductive pattern and comprising $CuO_x$ ($0<x\leq1$).

The present inventors have found that in a touch screen panel comprising a conductive metal fine pattern provided on an effective screen part, light reflection and diffraction properties by the pattern layer principally affect visibility of the conductive metal fine pattern, and have made an effort to improve the situation. Specifically, in the existing touch screen panel based on an ITO, a problem caused by reflectance of a conductive pattern does not have great impact due to high transmittance of the ITO itself, but the present inventors have found that in a touch screen panel comprising a conductive metal fine pattern provided in an effective screen part, reflectance and darkened properties of the conductive metal fine pattern are important.

In the touch screen panel according to an exemplary embodiment of the present invention, a darkened pattern may be introduced in order to lower the reflectance of the conductive metal fine pattern and improve absorbance properties. The darkened pattern may be provided on at least one surface of the conductive pattern in the touch screen panel, thereby greatly improving a visibility reduction problem due to high reflectance of the conductive pattern.

Specifically, the darkened pattern has light absorbing characteristics and thus may lower the reflectance caused by a conductive pattern by reducing the amount of light incident to the conductive pattern itself and light reflected from the conductive pattern. Furthermore, the darkened pattern may have a lower reflectance than that of the conductive pattern. Whereby, the reflectance of light may be lowered compared to the case where a user directly looks at the conductive pattern, and thus the visibility of the conductive pattern may be greatly improved.

In the present specification, the darkened pattern means a layer that has light absorbing characteristics and thus is capable of reducing the amount of light incident to the conductive pattern itself and light reflected from the conductive pattern, and a darkened pattern may be expressed as a term such as a light absorption pattern, a blackened pattern, a blackening pattern, and the like.

In an exemplary embodiment of the present invention, the conductive structure body may have a sheet resistance from 1Ω/☐ to 300Ω/☐, specifically 1Ω/☐ to 100Ω/☐, more specifically from 1Ω/☐ to 50Ω/☐, and even more specifically 1Ω/☐ to 20 Ω/☐.

When the sheet resistance of the conductive structure body is from 1Ω/☐ to 300Ω/☐, there is an effect that the ITO transparent electrode in the related art may be replaced. When the sheet resistance of the conductive structure body is from 1Ω/☐ to 100Ω/☐, or from 1Ω/☐ to 50Ω/☐, and particularly, from 1Ω/☐ to 20Ω/☐, the sheet resistance is considerably low compared to when the ITO transparent electrode in the related art is used, and thus there is an advantage in that when a signal is applied, the RC delay becomes short and the touch recognition rate may be significantly improved, and it is easy to apply the conductive structure body to a touch screen having a large area of 10 inches or more.

In the conductive structure body, the sheet resistance of the conductive layer or the darkened layer prior to patterning may be more than 0Ω/☐ and 2Ω/☐ or less, and specifically more than 0Ω/☐ and 0.7Ω/☐ or less. When the sheet resistance is 2Ω/☐ or less, particularly 0.7Ω/☐ or less, the lower the sheet resistance of the conductive layer or the darkened layer prior to patterning is, the easier the design and manufacturing process of the fine patterning proceeds, and the sheet resistance of the conductive structure body after patterning is reduced, and thus there is an effect that a reaction rate of the electrode is accelerated. The sheet resistance may be controlled depending on the thickness of the conductive layer or the darkened layer.

The conductive structure body according to an exemplary embodiment of the present invention may have an average extinction coefficient k in a visible light region from 0.2 to 1.5, and specifically from 0.4 to 1.0. When the average extinction coefficient k is 0.2 or more, there is an effect that is capable of achieving darkening. The average extinction coefficient k is also referred to as an absorption coefficient, and is a factor that determines the transmittance of the conductive structure body, as a measure which may define how strongly the conductive structure body absorbs light at a specific wavelength. For example, in the case of a transparent dielectric material, k<0.2, in which the K value is very small. However, the higher the content of a metal component in a material is, the higher the k value is. If the content of the metal component is further increased, transmission rarely occurs, and in most cases, the metal becomes a metal on which only a surface reflection occurs, and the extinction coefficient k becomes more than 1.5, which is not preferable to form a darkened pattern.

In an exemplary embodiment of the present invention, the conductive structure body may have an average refractive index from 2 to 3 in a visible light region.

In the present specification, the visible light region means a region having a wavelength from 360 nm to 820 nm.

In an exemplary embodiment of the present invention, the darkened pattern may have a thickness from 20 nm to 60 nm, specifically from 25 nm to 50 nm, and more specifically from 30 nm to 50 nm. In the darkened pattern, a preferred thickness may be different from each other depending on the material and manufacturing process used, but considering etching properties, it may not be easy to control the process when the thickness is less than 20 nm, and the darkened pattern may be disadvantageous in terms of a production rate when the thickness is more than 60 nm. When the thickness is specifically from 25 nm to 50 nm, and more specifically from 30 nm to 50 nm, it is easy to control the process and the production rate is improved, and thus the darkened pattern may be more advantageous in terms of a manufacturing process. In this case, the reflection is further reduced and the darkened pattern is better formed, and thus there is an advantageous effect.

In an exemplary embodiment of the present invention, the darkened pattern may have a total reflection of 20% or less, specifically 15% or less, more specifically 10% or less, and even more specifically 5% or less, and 3% or less. The smaller the total reflection is, the better the effect is.

The measurement of the total reflection may be performed in a direction opposite to a surface on which the darkened pattern is in contact with the conductive pattern. When the measurement is performed in this direction, the total reflection may be 20% or less, specifically 15% or less, more specifically 10% or less, and even more specifically 5% or less, and 3% or less. The smaller the total reflection is, the better the effect is.

Furthermore, the darkened pattern is provided between the conductive pattern and the substrate, and the measurement may be performed on the substrate side. When the total reflection is measured on the substrate side, the total reflection may be 20% or less, specifically 15% or less, more specifically 10% or less, and even more specifically 5% or less, and 3% or less. The smaller the total reflection is, the better the effect is.

In the present specification, the total reflection means a reflection to light having a wavelength from 300 nm to 800 nm, specifically from 380 nm to 780 nm, and more specifically 550 nm, which is incident to a surface to be measured at 90° after a surface opposite to the surface to be measured is treated with a black layer (perfect black).

In an exemplary embodiment of the present invention, the darkened pattern in the conductive structure body may have a total reflection of 20% or less, specifically 15% or less, more specifically 10% or less, and even more specifically 6% or less. The smaller the total reflection is, the better the effect is.

In the present specification, the total reflection may be a value measured based on a wavelength value from 300 nm to 680 nm, specifically from 450 nm to 650 nm, and more specifically 550 nm in reflection light reflected by a pattern layer or a conductive structure body to which light is incident when the incident light is defined as 100%.

In the conductive structure body according to an exemplary embodiment of the present invention, the darkened pattern may comprise a first surface which is in contact with the conductive pattern and a second surface facing the first surface. When the total reflection of the conductive structure body is measured on the second surface side of the darkened pattern, the total reflection Rt of the conductive structure body may be calculated by the following Equation 1.

Total reflection ($Rt$)=Reflection of substrate+Closing ratio×Reflection of darkened pattern  [Equation 1]

Further, when two conductive structure bodies are laminated in the configuration of the conductive structure body, the total reflection Rt of the conductive structure body may be calculated by the following Equation 2.

Total reflection ($Rt$)=Reflection of substrate+Closing ratio×Reflection of darkened pattern×2  [Equation 2]

In Equations 1 and 2, the reflection of the substrate may be a reflection of a touch reinforced glass, and when the surface is a film, the reflection of the substrate may be a reflection of the film.

In addition, the closing ratio may be represented by an area ratio that a region covered by the conductive pattern takes based on the planar surface of the conductive structure body, that is, (1—aperture ratio).

Accordingly, the difference according to the presence or absence of a darkened pattern depends on the reflection of the darkened pattern. From this viewpoint, the total reflection Rt of the conductive structure body according to an exemplary embodiment of the present invention may be reduced from 10% to 20%, from 20% to 30%, from 30% to 40%, from 40% to 50%, and 50% to 70%, compared to the total reflection Ro of a conductive structure body having the same configuration except for the absence of the darkened pattern. That is, in Equations 1 and 2, when the range of the total reflection is changed from 1% to 30% while changing the range of the closing ratio to a range from 1% to 10%, it is possible to show an effect that the total reflection is reduced by a maximum of 70%, and to show an effect that the total reflection is reduced by a minimum of 10%.

In the conductive structure body according to an exemplary embodiment of the present invention, the darkened pattern comprises a first surface which is in contact with the conductive pattern and a second surface facing the first surface, and when the total reflection of the conductive structure body is measured on the second surface side of the darkened pattern, the difference between the total reflection Rt of the conductive structure body and the total reflection Ro of the substrate may be 40% or less, 30% or less, 20% or less, and 10% or less.

In an exemplary embodiment of the present invention, the conductive structure body may have a brightness value (L*) of 50 or less, and more specifically 20 or less based on the CIE (Commission Internationale de l'Eclairage) L*a*b* color coordinate. The smaller the brightness value is, the lower the total reflection becomes, and thus there is an advantageous effect.

In an exemplary embodiment of the present invention, a pinhole may be rarely present in the conductive structure body, and even when the pinhole is present, the diameter thereof may be 3 μm or less, and more specifically 1 μm or less. When the pinhole diameter in the conductive structure body is 3 μm or less, disconnection may be prevented from occurring. In addition, when a pinhole is rarely present in the conductive structure body, and thus the number of pinholes is very small, disconnection may be prevented from occurring.

In an exemplary embodiment of the present invention, the darkened pattern may be patterned simultaneously or separately with the conductive pattern.

In an exemplary embodiment of the present invention, the darkened pattern and the conductive pattern may form a laminate structure simultaneously or by a separate patterning process. In this respect, the laminate structure may be differentiated from a structure in which at least a part of a light absorbing material is depressed or dispersed in a conductive pattern, or a structure in which a part of a conductive pattern of a single layer on the surface side has been physically or chemically modified by an additional surface treatment.

Further, in the conductive structure body according to an exemplary embodiment of the present invention, the darkened pattern may be provided directly on the substrate or the conductive pattern without interposing an adhesion layer or an adhesive layer. The adhesion layer or the adhesive layer may affect durability or optical properties. In addition, the conductive structure body according to an exemplary embodiment of the present invention is completely different from the case of using an adhesion layer or an adhesive layer in a manufacturing method. Furthermore, the conductive structure body according to an exemplary embodiment of the present invention has excellent interfacial properties of a substrate or a conductive pattern and a darkened pattern, compared to the case of using an adhesion layer or an adhesive layer.

In an exemplary embodiment of the present invention, the darkened pattern may be composed of a single layer, or multi layers having two or more layers.

In an exemplary embodiment of the present invention, it is preferred that the darkened pattern displays a color in the achromatic color series. At this time, the color in the achromatic color series means a color that does not selectively absorb light incident to the surface of an object and appears until the light is evenly reflected and absorbed with respect to the wavelength of each component.

In an exemplary embodiment of the present invention, the darkened pattern may additionally comprise at least one of a dielectric material and a metal. Examples of the dielectric material comprise SiO, $SiO_2$, $MgF_2$, $SiN_x$ (x is an integer of 1 or more), and the like, but are not limited thereto. Examples of the metal comprise Fe, Co, Ti, V, Al, Au, Ag, and the like, but are not limited thereto. In an exemplary embodiment of the present invention, the darkened pattern may additionally comprise one or more of a dielectric material and one or more of a metal.

In an exemplary embodiment of the present invention, it is preferred that the dielectric material is distributed so as to be gradually decreased as the dielectric material becomes farther from the direction to which external light is incident, and the metal is distributed the other way. At this time, the dielectric material may have a content from 20% by weight to 50% by weight, and the metal may have a content from 50% by weight to 80% by weight.

In an exemplary embodiment of the present invention, the darkened pattern may be provided only on one surface of the conductive pattern, or on both surfaces thereof. Here, the darkened pattern may have a pattern having the same shape as that of the conductive pattern. However, the pattern dimension of the darkened pattern need not be completely the same as that of the conductive pattern, and the case where the line width of the darkened pattern is narrow or wide compared to the line width of the conductive pattern is also encompassed in the scope of the present invention.

In an exemplary embodiment of the present invention, the darkened pattern may have a pattern shape having a line width which is smaller or larger than the line width of the conductive pattern. For example, the darkened pattern may have an area which is 80% to 120% of the area in which the conductive pattern is provided.

In an exemplary embodiment of the present invention, the darkened pattern preferably has a pattern shape having a line width which is the same as or larger than the line width of the conductive pattern.

When the darkened pattern has a pattern shape having a line width which is larger than the line width of the conductive pattern, the darkened pattern may more greatly impart an effect that the darkened pattern blocks the conductive pattern while being observed by a user, and thus there is an advantage in that the darkened pattern may efficiently block an effect caused by gloss or reflection of the conductive pattern itself. However, even when the line width of the darkened pattern is the same as the line width of the conductive pattern, an effect to be targeted by the present invention may be achieved.

In the conductive structure body according to an exemplary embodiment of the present invention, a transparent substrate may be used as the substrate, but the substrate is not particularly limited, and for example, glass, a plastic substrate, a plastic film, and the like may be used.

In an exemplary embodiment of the present invention, the thickness of the conductive pattern is not particularly limited, but a thickness from 0.01 μm to 10 μm may exhibit a better effect in terms of conductivity of the conductive layer and economic efficiency of the pattern forming process.

In an exemplary embodiment of the present invention, a material of the conductive pattern is appropriately a material having a specific resistance from $1 \times 10^6$ Ω·cm to $30 \times 10^6$ Ω·cm, and may have preferably from $1 \times 10^6$ Ω·cm to $7 \times 10^6$ Ω·cm.

In the conductive structure body according to an exemplary embodiment of the present invention, the material of the conductive pattern may comprise one or more of a metal, a metal alloy, a metal oxide, a metal nitride, and the like. The material of the conductive pattern may be a metal material which has excellent electrical conductivity and is easily etched. However, in general, a material having excellent electrical conductivity is disadvantageous in high reflectance. However, the darkened pattern may be used in the present invention, thereby forming a conductive pattern using a material having high reflectance. In the present invention, even when a material having a reflectance from 70% to 80% is used, by adding the darkened pattern, the reflectance may be lowered, the concealment of the conductive pattern may be improved, and contrast properties may be maintained or improved.

In an exemplary embodiment of the present invention, specific examples of the material of the conductive pattern comprise a single film or a multilayer film comprising one or more of copper, aluminum, silver, neodymium, molybdenum, nickel, an alloy thereof, an oxide thereof, a nitride thereof, and the like, and more preferably copper.

When the conductive pattern comprises copper, the darkened pattern comprises $CuO_x$ ($0<x\leq1$), and thus it is possible to perform a collective etching, and as a result, the efficiency is high and the cost is reduced in the production process, and thus the conductive pattern is economically advantageous. Further, copper has a specific resistance of $1.7\times10^{-6}$ cm and thus is more advantageous than Al having a specific resistance of $2.8\times10^{-6}$ cm. Therefore, in order to satisfy a sheet resistance value more than $0\Omega/\square$ and $2\Omega/\square$ or less, and preferably more than $0\Omega/\square$ and $0.7\Omega/\square$ or less, copper is advantageous in that the thickness of the conductive pattern may be thinner than that of a conductive pattern formed of Al. The sheet resistance may be controlled depending on the thickness of the conductive pattern. For example, in order for the sheet resistance to satisfy from $0.6\Omega/\square$ to $0.7\Omega/\square$, Al needs to be formed to have a thickness from 80 nm to 90 nm, but Cu needs to be formed to have a thickness from 55 nm to 65 nm and thus is economical because the thickness of the pattern formed may be thinner. In addition, referring to Experimental Example 6, Cu has a better yield by approximately 2.5 times than Al in the sputtering process, and thus it is possible to expect an improvement in deposition rate by 4 to 5 times theoretically. Therefore, the conductive pattern comprising Cu has high efficiency and is economical in the production process and thus has an excellent advantage.

In an exemplary embodiment of the present invention, the conductive pattern may have a line width more than 0 μm and 10 μm or less, specifically from 0.1 μm to 10 μm, more specifically from 0.2 μm to 8 μm, and even more specifically from 0.5 μm to 5 μm.

In an exemplary embodiment of the present invention, the aperture ratio of the conductive pattern, that is, the ratio of the area that is not covered by the pattern may be 70% or more, 85% or more, and 95% or more. Furthermore, the aperture ratio of the conductive pattern may be from 90% to 99.9%, but is not limited thereto.

In an exemplary embodiment of the present invention, the conductive pattern may be a regular pattern, or an irregular pattern.

As the regular pattern, a pattern form in the art, such as a mesh pattern, and the like may be used. The irregular pattern is not particularly limited, but may also be a boundary form of figures constituting a Voronoi diagram. When an irregular pattern and a darkened pattern are used together in the present invention, a diffraction pattern of reflection light caused by illumination having directivity may be removed by the irregular pattern, and an influence by scattering of light may be minimized by the darkened pattern, thereby minimizing a problem in visibility.

In an exemplary embodiment of the present invention, the conductive pattern comprises a border structure of closed figures which are continuously connected, no closed figure having the same shape is present in any unit area (1 cm×1 cm) of the conductive pattern, and the number of vertices of the closed figures may be different from the number of vertices of quadrangles having the same number as the number of the closed figures.

The number of vertices of the closed figures is different from the number of vertices of the quadrangles having the same number as the number of the closed figures. More specifically, the number of vertices of the closed figures may be greater than the number of vertices of the quadrangles having the same number as the number of the closed figures, and 1.9 times to 2.1 times greater than the number of vertices of the quadrangles, but is not limited thereto.

In an exemplary embodiment of the present invention, the closed figures are continuously connected to each other, and for example, when the closed figures are a polygon, closed figures adjacent to each other may have a form of sharing at least one side.

In an exemplary embodiment of the present invention, the conductive pattern comprises a border structure of closed figures which are continuously connected, no closed figure having the same shape is present in any unit area (1 cm×1 cm) of the conductive pattern, and the number of vertices of the closed figures may be different from the number of vertices of a polygon formed by connecting the shortest distance between centers of gravity of each of the closed figures.

The number of vertices of the closed figures is different from the number of vertices of a polygon formed by connecting the shortest distance between centers of gravity of each of the closed figures. More specifically, the number of vertices of the closed figures may be greater than the number of vertices of a polygon formed by connecting the shortest distance between centers of gravity of each of the closed figures, and 1.9 times to 2.1 times greater than the number of vertices of the polygon, but is not limited thereto.

An exemplary embodiment of the present invention provides a conductive substrate in which the conductive pattern comprises a border structure of closed figures which are continuously connected, no closed figure having the same shape is present in any unit area (1 cm×1 cm) of the conductive pattern, and the closed figures has a value of the following Equation 3, which is 50 or more.

(Standard deviation of distance between vertices/average of distance between vertices)×100     [Equation 3]

An exemplary embodiment of the present invention provides a conductive substrate in which when an image of a transmission-type diffraction pattern is obtained by irradiating a straight light emitted from a light source on one surface of the conductive pattern, the image has a value of Equation 4, which is less than 21.

(Standard deviation of strength of transmission-type diffraction pattern according to angle region/ Average strength of transmission-type diffraction pattern according to angle region)×100     [Equation 4]

In Equation 4, the angle region means a region in which 0 to 360 degrees from the image center of the transmission-type diffraction pattern are each divided by 10 degrees.

When the image of the transmission-type diffraction pattern is obtained, the image may have a value of Equation 4, which is less than 21, 15 or less, and 10 or less.

In an exemplary embodiment of the present invention, the conductive pattern comprises a border structure of closed figures which are continuously connected, and the border structure of the closed figures may be modified in various ways, such as a straight line, a curved line, a zigzag, a combination thereof, and the like.

In an exemplary embodiment of the present invention, the same closed figure may not be present in a unit area of the conductive pattern.

In an exemplary embodiment of the present invention, the conductive pattern comprises a border structure of closed figures which are continuously connected, and when 0 to 180 degrees of an angle of lines constituting the border of the closed figures with respect to any straight line are divided by a unit of 10 degrees, the value of the following Equation 5 may be less than 21, 15 or less, and 10 or less for the numbers of lines belonging to each of the angle range.

(Standard deviation of number of lines corresponding to angle range/Average of number of lines corresponding to angle range)×100   [Equation 5]

In an exemplary embodiment, the values of Equations 3 to 5 in the conductive pattern may be calculated in a unit area of an electrical conductive pattern. The unit area may be an area in which an electrical conductive pattern is formed, and may be, for example, 3.5 cm×3.5 cm, and the like, but is not limited thereto.

The vertex is defined as a point at which lines constituting a border of closed figures of an electrical conductive pattern cross each other.

By forming a pattern as described above, a fine electrical conductive pattern required for a touch screen may be implemented. In the touch screen, when the fine electrical conductive pattern fails to be implemented, physical properties required for a touch screen such as resistance and the like may not be achieved.

A touch screen using a metal mesh pattern in the related art basically fails to provide a solution for evading a phenomenon called Moire, and thus an irregular pattern was applied as an electrical conductive pattern in the present invention. At this time, in order to confirm a critical value at which the Moire phenomenon does not occur at all regardless of a display, the critical value has been tried to be quantified by confirming whether the Moire occurs according to each degree of irregularity, and a reflection-type diffraction phenomenon.

In an exemplary embodiment of the present invention, the conductive pattern comprises a border structure of closed figures which are continuously connected, and the number of vertices of the closed figures is different from the number of vertices of the quadrangles having the same number as the number of the closed figures.

In an exemplary embodiment of the present invention, the conductive pattern comprises a border structure of closed figures which are continuously connected, and the number of vertices of the closed figures is different from the number of vertices of a polygon formed by connecting the shortest distance between centers of gravity of each of the closed figures.

In an exemplary embodiment of the present invention, the conductive pattern comprises a border structure of closed figures which are continuously connected, and the closed figures have a value of Equation 3, which is 50 or more.

In an exemplary embodiment of the present invention, the conductive pattern may be a form of a border structure of closed figures constituted by connecting a point closest to each point compared to a distance from the other points after any points are each disposed in a regularly arranged unit cell.

At this time, when the degree of irregularity is introduced into a method by which any points are disposed in the regularly arranged unit cell, the electrical conductive pattern according to the present invention may be formed. For example, when 0 is imparted to the degree of irregularity, a regular square mesh structure is formed in the electrical conductive pattern when the unit cell is a regular square, and a honeycomb structure is formed in the electrical conductive pattern when the unit cell is a regular hexagon. That is, the conductive pattern according to the present invention means a pattern in which the degree of irregularity is not 0.

The conductive pattern having an irregular pattern form according to the present invention may suppress a tipping phenomenon and the like of a line forming a pattern, may allow a uniform transmittance to be obtained from a display, may allow a line density with respect to a unit area to be maintained at the same level, and may secure uniform conductivity.

In an exemplary embodiment of the present invention, the number of vertices of the closed figures in a unit area (3.5 cm×3.5 cm) of the conductive pattern may be 6,000 or more, 7,000 or more, 15,000 or more, and 245,000 or less, but may be adjusted depending on transmittance and conductivity desired by the person skilled in the art.

In an exemplary embodiment of the present invention, the conductive pattern may have a line width of 10 μm or less, and the number of vertices of the closed figures may be from 6,000 to 245,000 in an area of 3.5 cm×3.5 cm of the electrical conductive pattern. Further, the conductive pattern may have a line width of 7 μm or less, and the number of vertices of the closed figures may be from 7,000 to 62,000 in an area of 3.5 cm×3.5 cm of the conductive pattern. In addition, the conductive pattern may have a line width of 5 μm or less, and the number of vertices of the closed figures may be from 15,000 to 62,000 in an area of 3.5 cm×3.5 cm of the conductive pattern.

At least one of the figures forming the pattern in a unit area may have a form different from the other figures.

In an exemplary embodiment of the present invention, the darkened pattern and the conductive pattern may have a positive tapered angle on the side surface thereof, but the darkened pattern or the conductive pattern disposed on a surface opposite to the substrate side of the conductive pattern may also have a reverse tapered angle.

Figure 2:
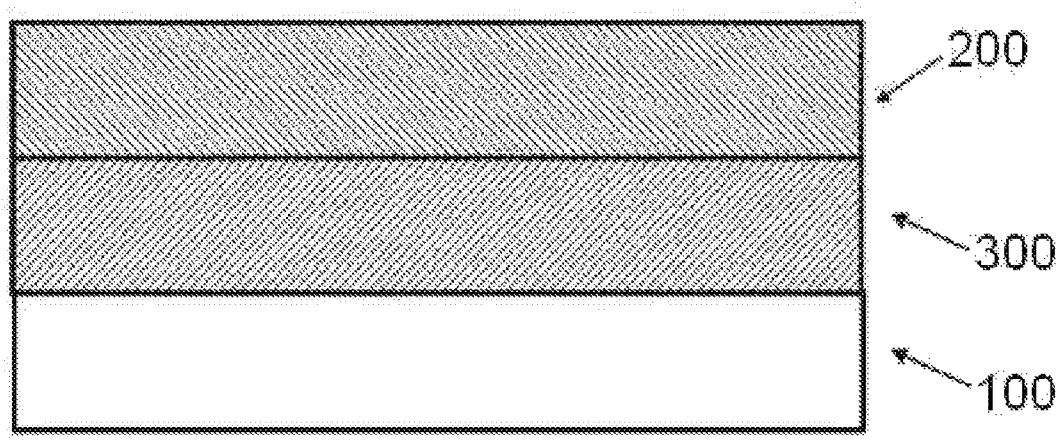
Figure 3:
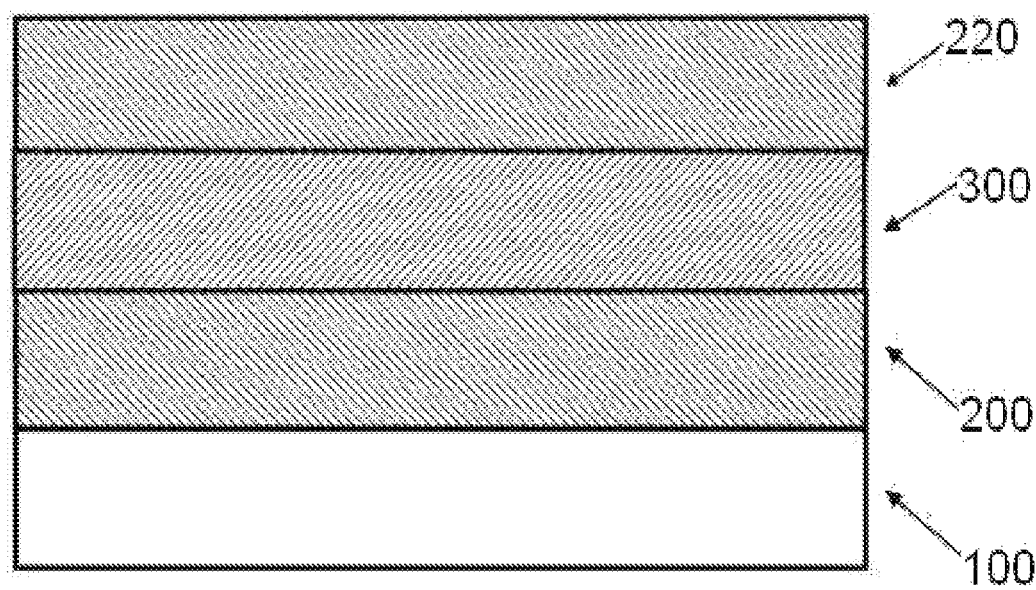

Examples of the conductive structure body according to an exemplary embodiment of the present invention are illustrated in the following FIGS. 1 to 3. FIGS. 1 to 3 are for illustrating the lamination order of a substrate, a conductive pattern, and a darkened pattern, and the conductive pattern and the darkened pattern may be a pattern form rather than a front layer when actually applied for a fine transparent electrode, such as a touch screen panel, and the like.

FIG. 1 illustrates the case where a darkened pattern 200 is disposed between a substrate 100 and a conductive pattern 300. When a user looks at a touch screen panel from the substrate side, the reflectance caused by the conductive pattern may be greatly reduced.

FIG. 2 illustrates the case where the darkened pattern 200 is disposed on the conductive pattern 300. When a user looks at a touch screen panel from a surface opposite to the substrate side, the reflectance caused by the conductive pattern may be greatly reduced.

FIG. 3 illustrates the case where the darkened patterns 200 and 220 are all disposed between the substrate 100 and the conductive pattern 300, and on the conductive pattern 300. When a user looks at a touch screen panel from both the substrate side and a side opposite thereto, the reflectance caused by the conductive layer may be greatly reduced.

In the structure of the conductive structure body according to an exemplary embodiment of the present invention, the darkened pattern may be provided on at least one surface of the conductive pattern.

The structure of the conductive structure body according to an exemplary embodiment of the present invention may be a structure in which a substrate, a darkened pattern, a conductive pattern, and a darkened pattern are sequentially laminated. Furthermore, the conductive structure body may additionally comprise a conductive pattern and a darkened pattern on the outermost darkened pattern.

That is, the structure of the conductive structure body according to an exemplary embodiment of the present invention may be a structure of a substrate/a darkened pattern/a conductive pattern, a structure of a substrate/a conductive pattern/a darkened pattern, a structure of a substrate/a darkened pattern/a conductive pattern/a darkened pattern, a structure of a substrate/a conductive pattern/a darkened pattern/a conductive pattern, a structure of a substrate/a darkened pattern/a conductive pattern/a darkened pattern/a conductive pattern/a darkened pattern, a structure of a substrate/a darkened pattern/a conductive pattern/a darkened pattern/a conductive pattern/a darkened pattern/a conductive pattern/a darkened pattern, and the like.

A method for manufacturing a conductive structure body according to an exemplary embodiment of the present invention comprises: forming a conductive pattern having a line width of 10 µm or less on a substrate; and forming a darkened pattern comprising $CuO_x$ ($0 < x \leq 1$) in a thickness from 20 nm to 60 nm before, after, or before and after the conductive pattern is formed, in which the conductive structure body has an average refractive index from 2 to 3 and an average extinction coefficient (k) from 0.2 to 1.5 in a visible light region.

A method for manufacturing a conductive structure body according to an exemplary embodiment of the present invention comprises: forming a conductive layer on a substrate; forming a darkened layer comprising $CuO_x$ ($0 < x \leq 1$) in a thickness from 20 nm to 60 nm before, after, or before and after the conductive layer is formed; and forming a conductive pattern and a darkened pattern, which have a line width of 10 µm or less, by patterning the conductive layer and the darkened layer separately or simultaneously, in which the conductive structure body has an average refractive index from 2 to 3 and an average extinction coefficient (k) from 0.2 to 1.5 in a visible light region.

In an exemplary embodiment of the present invention, the method for manufacturing a conductive structure body may form a darkened layer on a substrate, form a conductive layer after the darkened layer is formed, and form a darkened layer after the conductive layer is formed, and may comprise separately or simultaneously patterning the darkened layer and the conductive layer.

In the method for manufacturing a conductive structure body, the sheet resistance of the conductive layer or the darkened layer prior to patterning may be more than $0\Omega/\square$ and $2\Omega/\square$ or less, and preferably more than $0\Omega/\square$ and $0.7\Omega/\square$ or less. When the sheet resistance is $2\Omega/\square$ or less, particularly $0.7\Omega/\square$ or less, the lower the sheet resistance of the conductive layer or the darkened layer prior to patterning is, the easier the design and manufacturing process of the fine patterning proceeds, and the sheet resistance of the conductive structure body after patterning is reduced, and thus there is an effect that a reaction rate of the electrode is accelerated.

In an exemplary embodiment of the present invention, the darkened pattern or the darkened layer in forming of the darkened pattern or the darkened layer may be formed using a method known in the art. For example, the darkened pattern or darkened layer may be formed by a method, such as deposition, sputtering, wet coating, evaporation, electrolytic plating or electroless plating, lamination of a metal foil, and the like, and may be formed by specifically a sputtering method.

For example, when a conductive layer comprising Cu and a darkened layer comprising $CuO_x$ ($0 < x \leq 1$) are formed, there is an advantage obtained by using a CuO single material sputtering target when an inert gas, for example, a gas such as Ar is used as a sputtering gas. For example, when a reactive sputtering method is used using an Al metal target such as $AlO_xN_y$, the partial pressure of a reactive gas such as $O_2$ and $N_2$ needs to be controlled. However, the present invention uses a single material target such as CuO and thus is advantageous in that the process is relatively easily controlled because it is unnecessary to control the partial pressure of the reactive gas, and it is possible to perform collective etching using a Cu etchant even for forming a final conductive structure body.

In exemplary embodiment of the present invention, the method for forming a conductive pattern is not particularly limited, and the conductive pattern may be directly formed by a printing method, and a method of forming a conductive layer and then patterning the same may be used.

In an exemplary embodiment of the present invention, when the conductive pattern is formed by a printing method, an ink or paste of a conductive material may be used, and the paste may further comprise a binder resin, a solvent, a glass frit, and the like in addition to the conductive material.

When a conductive layer is formed and then patterned, a material having etching resist characteristics may be used.

In an exemplary embodiment of the present invention, the conductive layer may be formed by a method such as deposition, sputtering, wet coating, evaporation, electrolytic plating or electroless plating, lamination of a metal foil, and the like. As the method for forming a conductive layer, it is also possible to use a method of coating a solution of an organic metal, a nano metal, or a composite thereof on a substrate, and then imparting conductivity thereto by sintering and/or drying. As the organic metal, an organic silver may be used, and as the nano metal, a nano silver particle, and the like may be used.

In an exemplary embodiment of the present invention, the conductive layer may be patterned by using a method using an etching resist pattern. The etching resist pattern may be formed by using a printing method, a photolithography method, a photography method, a method using a mask, or a laser transfer, for example, a thermal transfer imaging, and the like, and the method is more preferably a printing method or a photolithography method, but is not limited thereto. The conductive thin film layer is etched and patterned using the etching resist pattern, and the etching resist pattern may be easily removed by a strip process.

An exemplary embodiment of the present invention provides a touch screen panel comprising the conductive structure body. For example, in an electrostatic capacity-type touch screen panel, the conductive structure body according to an exemplary embodiment of the present invention may be used as a touch response-type electrode substrate.

An exemplary embodiment of the present invention provides a display device comprising the touch screen panel.

The touch screen panel according to an exemplary embodiment of the present invention may further comprise an additional structure body in addition to the above-described conductive structure body comprising a substrate, a conductive pattern, and a darkened pattern. In this case, two structure bodies may be disposed in the same direction, and may be disposed in a direction opposite to each other. Two or more structure bodies, which may be comprised in the touch screen panel of the present invention, do not need to have the same structure, and any one, preferably only a structure body on a side closest to a user may comprise the substrate, the conductive pattern, and the darkened pattern, which have been described above, and a structure body additionally comprised may not comprise a darkened layer which has been patterned. Further, the layer laminate structures in two or more structure bodies may be different from each other. When two or more structure bodies are comprised, an insulation layer may be provided therebetween. At this time, a function as an adhesive layer may be additionally imparted to the insulation layer.

A touch screen panel according to an exemplary embodiment of the present invention may comprise: a lower substrate; an upper substrate; and an electrode layer provided on one surface of a surface of the lower substrate in contact with the upper substrate and a surface of the upper substrate in contact with the lower substrate, or both surfaces thereof. The electrode layer may serve to detect the X-axis position and the Y-axis position.

At this time, one or both of an electrode layer provided on the lower substrate and a surface of the lower substrate in contact with the upper substrate, and an electrode layer provided on the upper substrate and a surface of the upper substrate in contact with the lower substrate may be the above-described conductive structure body according to an exemplary embodiment of the present invention. When only one of the electrode layers is the conductive structure body according to the present invention, the other one may have a conductive pattern known in the art.

When an electrode layer is provided on one surface of both the upper substrate and the lower substrate to form a two-layered electrode layer, an insulation layer or a spacer may be provided between the lower substrate and the upper substrate such that the interval between the electrode layers is constantly maintained and connection thereof does not occur. The insulation layer may comprise an adhesive or a UV or thermally curable resin. The touch screen panel may further comprise a ground part connected to the conductive pattern in the above-described conductive structure body. For example, the ground part may be formed at an edge portion of a surface on which the conductive pattern of the substrate is formed. In addition, at least one of an antireflection film, a polarizing film, and an anti-fingerprint film may be provided on at least one surface of a laminate comprising the conductive structure body. A different type of functional film may be further comprised in addition to the above-described functional films depending on the design specification. The touch screen panel as described above may be applied to a display device, such as an OLED display panel (PDP), a liquid crystal display (LCD), a cathode-ray tube (CRT), and a PDP.

In the touch screen panel according to an exemplary embodiment of the present invention, a conductive pattern, and a darkened pattern may be each provided on both surfaces of the substrate.

The touch screen panel according to an exemplary embodiment of the present invention may additionally comprise an electrode part or a pad part on the conductive structure body. At this time, an effective screen part, an electrode part, and a pad part may be formed of the same conductive structure body.

In the touch screen panel according to an exemplary embodiment of the present invention, the darkened pattern may be provided on a side at which a user looks.

An exemplary embodiment of the present invention provides a display device comprising the conductive structure body. The conductive structure body according to an exemplary embodiment of the present invention may be used in a color filter substrate, a thin film transistor substrate, or the like in the display device.

An exemplary embodiment of the present invention provides a solar cell comprising the conductive structure body. For example, the solar cell may comprise an anode electrode, a cathode electrode, a photoactive layer, a hole transporting layer and/or an electron transporting layer, and the conductive structure body according to an exemplary embodiment of the present invention may be used as the anode electrode and/or the cathode electrode.

The conductive structure body may replace the ITO in the related art in a display device or a solar cell, and may be utilized for a flexible use. Furthermore, the conductive structure body may be utilized as a next-generation transparent electrode along with CNTs, a conductive polymer, graphene, and the like.

[Best Mode]

The present invention will be described in more detail with reference to Examples, Comparative Examples, and Experimental Examples. However, the following Examples, Comparative Examples, and Experimental Examples are provided for illustrative purposes only, and the scope of the present invention is not limited thereto in any manner.

Example 1

A Cu layer was formed to have a thickness of 60 nm as a conductive layer on a polyethyleneterephthalate (PET) substrate by a direct current power source sputtering (DC sputtering) method using a Cu single target, and a darkened layer comprising $CuOx$ ($0<x\leq1$) was formed to have a thickness of 35 nm by a radio frequency sputtering (RF sputtering) method using a CuO single target, thereby manufacturing a conductive structure body of Example 1.

Example 2

A Cu layer was formed to have a thickness of 60 nm as a conductive layer on a polyethyleneterephthalate (PET) substrate by a direct current power source sputtering (DC sputtering) method using a Cu single target, and a darkened layer comprising $CuOx$ ($0<x\leq1$) was formed to have a thickness of 50 nm by an RF sputtering method using a CuO single target, thereby manufacturing a conductive structure body of Example 2.

Example 3

A Cu layer was formed to have a thickness of 60 nm as a conductive layer on a polyethyleneterephthalate (PET) substrate by a direct current power source sputtering (DC sputtering) method using a Cu single target, and a darkened layer comprising $CuOx$ ($0<x\leq1$) was formed to have a thickness of 60 nm by an RF sputtering method using a CuO single target, thereby manufacturing a conductive structure body of Example 3.

Example 4

An Al layer was formed to have a thickness of 80 nm as a conductive layer on a polyethyleneterephthalate (PET) substrate by a direct current power source sputtering (DC sputtering) method using an Al single target, and a darkened layer comprising $CuOx$ ($0<x\leq1$) was formed to have a thickness of 50 nm by an RF sputtering method using a CuO single target, thereby manufacturing a conductive structure body of Example 4.

Comparative Example 1

A Cu layer was formed to have a thickness of 60 nm as a conductive layer on a polyethyleneterephthalate (PET) substrate by a direct current power source sputtering (DC sputtering) method using a Cu single target, thereby manufacturing a conductive structure body of Comparative Example 1.

Comparative Example 2

An Al layer was formed to have a thickness of 80 nm as a conductive layer on a polyethyleneterephthalate (PET) substrate by a direct current power source sputtering (DC sputtering) method using an Al single target, thereby manufacturing a conductive structure body of Comparative Example 2.

Comparative Example 3

A Cu layer was formed to have a thickness of 60 nm as a conductive layer on a polyethyleneterephthalate (PET) substrate by a direct current power source sputtering (DC sputtering) method using a Cu single target, and a darkened layer comprising CuOx (0<x≤1) was formed to have a thickness of 10 nm by an RF sputtering method using a CuO single target, thereby manufacturing a conductive structure body of Comparative Example 3.

Comparative Example 4

A Cu layer was formed to have a thickness of 60 nm as a conductive layer on a polyethyleneterephthalate (PET) substrate by a direct current power source sputtering (DC sputtering) method using a Cu single target, and a darkened layer comprising CuOx (0<x≤1) was formed to have a thickness of 80 nm by an RF sputtering method using a CuO single target, thereby manufacturing a conductive structure body of Comparative Example 4.

Comparative Example 5

A Cu layer was formed to have a thickness of 60 nm as a conductive layer on a polyethyleneterephthalate (PET) substrate by a direct current power source sputtering (DC sputtering) method using a Cu single target, and a darkened layer comprising CuOx (0<x≤1) was formed to have a thickness of 100 nm by an RF sputtering method using a CuO single target, thereby manufacturing a conductive structure body of Comparative Example 5.

Comparative Example 6

A Cu layer was formed to have a thickness of 60 nm as a conductive layer on a polyethyleneterephthalate (PET) substrate by a direct current power source sputtering (DC sputtering) method using a Cu single target, and a darkened layer comprising CuOx (0<x≤1) was formed to have a thickness of 10 nm by an RF sputtering method using a CuO single target, thereby manufacturing a conductive structure body of Comparative Example 6.

Comparative Example 7

A Cu layer was formed to have a thickness of 60 nm as a conductive layer on a polyethyleneterephthalate (PET) substrate by a direct current power source sputtering (DC sputtering) method using a Cu single target, and a darkened layer comprising CuOx (0<x≤1) was formed to have a thickness of 30 nm by a radio frequency sputtering (RF sputtering) method using a CuO single target, thereby manufacturing a conductive structure body of Comparative Example 7.

Comparative Example 8

A Cu layer was formed to have a thickness of 60 nm as a conductive layer on a polyethyleneterephthalate (PET) substrate by a direct current power source sputtering (DC sputtering) method using a Cu single target, and a darkened layer comprising CuOx (0<x≤1) was formed to have a thickness of 50 nm by an RF sputtering method using a CuO single target, thereby manufacturing a conductive structure body of Comparative Example 8.

Comparative Example 9

A Cu layer was formed to have a thickness of 60 nm as a conductive layer on a polyethyleneterephthalate (PET) substrate by a direct current power source sputtering (DC sputtering) method using a Cu single target, and a darkened layer comprising CuOx (0<x≤1) was formed to have a thickness of 60 nm by an RF sputtering method using a CuO single target, thereby manufacturing a conductive structure body of Comparative Example 9.

Comparative Example 10

A Cu layer was formed to have a thickness of 60 nm as a conductive layer on a polyethyleneterephthalate (PET) substrate by a direct current power source sputtering (DC sputtering) method using a Cu single target, and a darkened layer comprising CuOx (0<x≤1) was formed to have a thickness of 80 nm by an RF sputtering method using a CuO single target, thereby manufacturing a conductive structure body of Comparative Example 9.

Experimental Example 1

Figure 4:
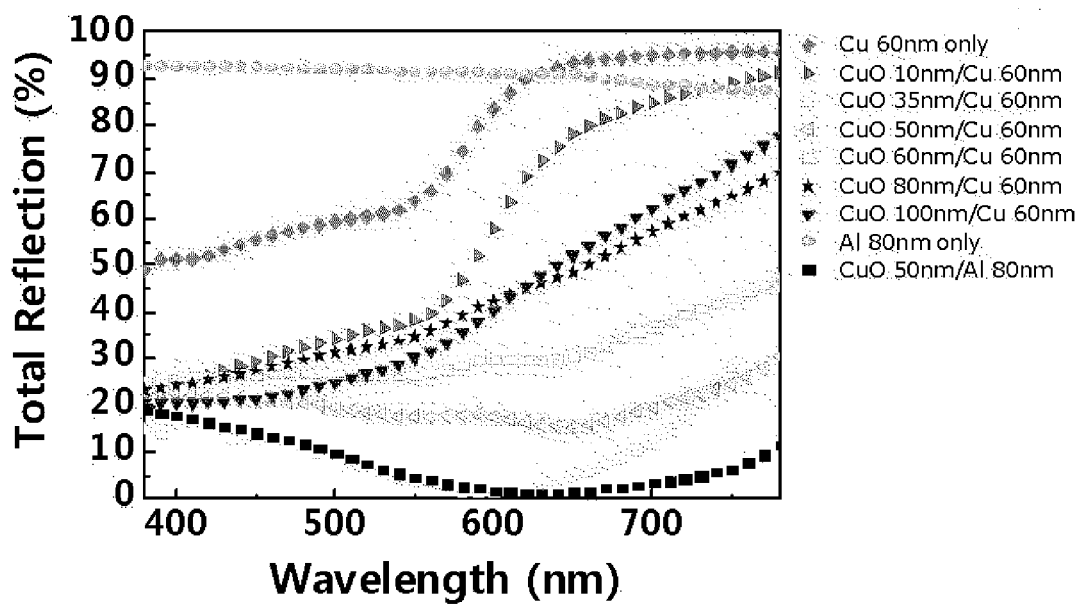
FIG. 4 illustrates the measured values of the total reflections depending on wavelengths in Examples 1 to 4 and Comparative Examples 1 to 5.

The total reflection according to the wavelength of the conductive structure bodies of Examples 1 to 4 and Comparative Examples 1 to 5 was simulated using a Solidspec 3700 (UUV-Vis spectrophotometer, manufactured by Shimadzu Corp.), and the results are shown in the following FIG. 4. Further, the average reflections of the conductive structure bodies of Examples 1 to 4 and Comparative Examples 1 to 5 in a visible light region are shown in the following Table 1.

TABLE 1

| Classification | Average reflection (%) |
| --- | --- |
| Example 1 | 11.0 |
| Example 2 | 20.1 |
| Example 3 | 31.1 |
| Example 4 | 7.3 |
| Comparative Example 1 | 75.2 |
| Comparative Example 2 | 90.8 |
| Comparative Example 3 | 55.5 |
| Comparative Example 4 | 42.1 |
| Comparative Example 5 | 41.4 |

As seen in the results in Table 1, it can be known that as in the present invention, the conductive structure body in which a darkened pattern has a thickness in a range from 20 nm to 60 nm had lower reflection properties than the case where the conductive structure body had a thickness exceeding the thickness range of the darkened pattern, and thus the concealment of the conductive pattern may be improved.

Experimental Example 2

Figure 6:
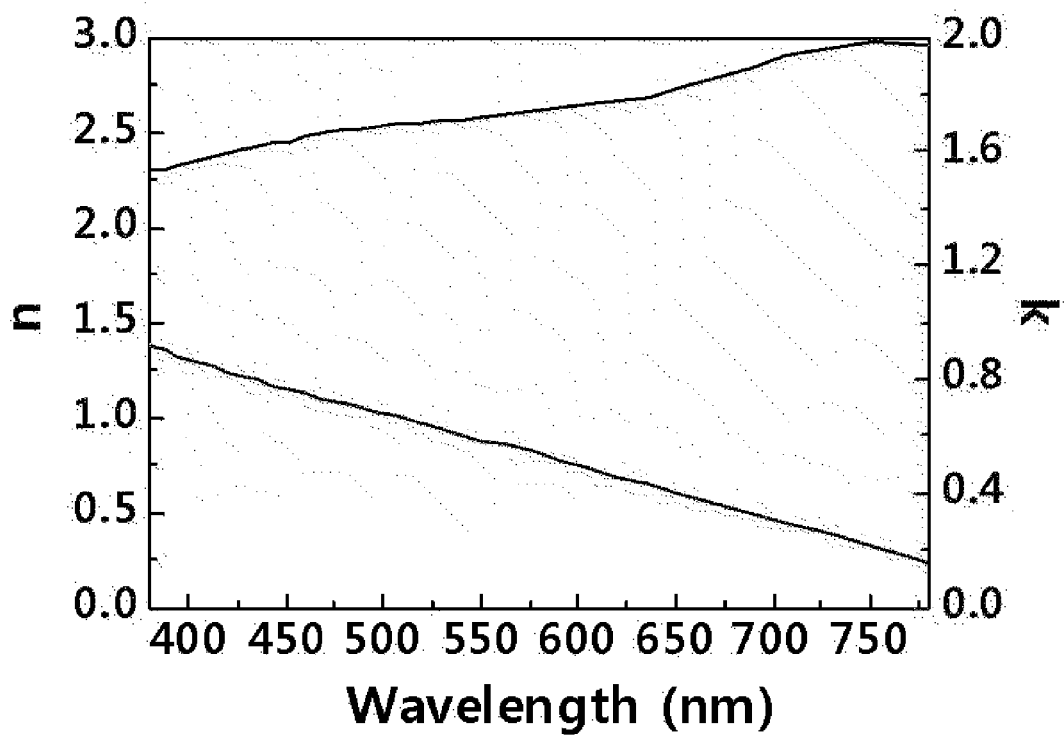
FIG. 6 illustrates an average refractive index (n) and an average extinction coefficient (k) of an optical constant in Examples 1, measured by an ellipsometer.

Average refractive indices (n) and average extinction coefficients (k) of the optical constants of the conductive structure bodies of Examples 1 to 4 were measured by an ellipsometer, and are shown in FIG. 6. More specifically, the average refractive indices and the average extinction coefficients of Examples 1 to 4 in a visible light region were 2.45 and 0.8, respectively.

Experimental Example 3

Average refractive indices (n) and average extinction coefficients (k) of the optical constants of the conductive structure bodies of Comparative Examples 6 to 10 were measured by an ellipsometer. More specifically, the average refractive indices and the average extinction coefficients of Comparative Examples 6 to 10 in a visible light region were 2.45 and 1.8, respectively.

Experimental Example 4

Figure 5:
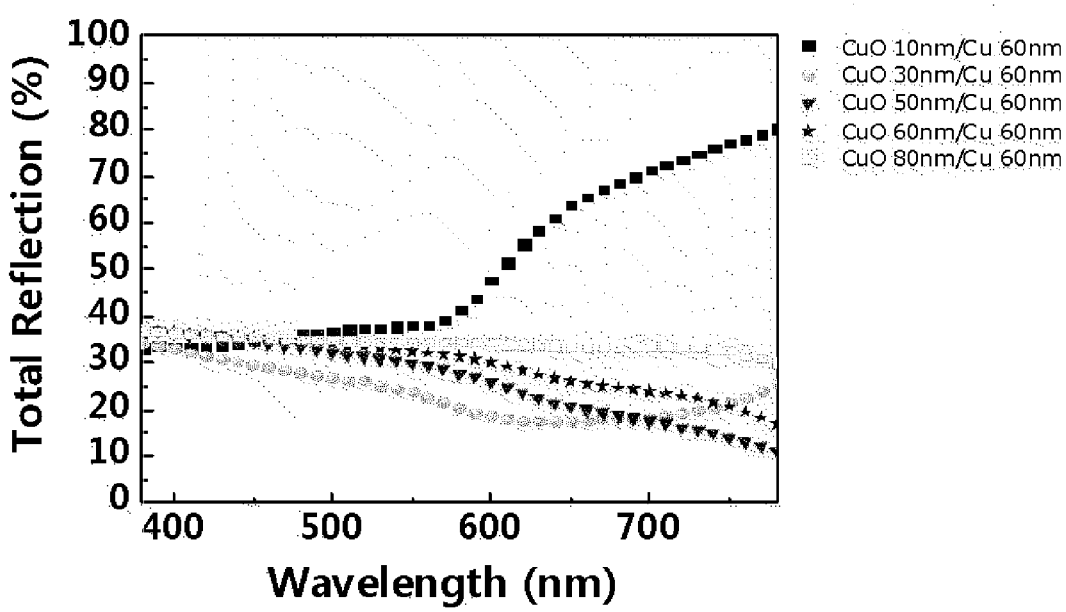
FIG. 5 illustrates the measured values of the total reflections depending on wavelengths in Comparative Examples 6 to 10.

The total reflection according to the wavelength of the conductive structure bodies of Comparative Examples 6 to 10 was simulated using a Solidspec 3700 (UV-Vis spectrophotometer, manufactured by Shimadzu Corp.), and the results are shown in the following FIG. 5. In addition, the average reflections of the conductive structure bodies of Examples 1 to 4 and Comparative Examples 6 to 10 in a visible light region are shown in the following Table 2.

TABLE 2

| Classification | Average refractive index | Average extinction coefficient | Average reflection (%) |
|---|---|---|---|
| Example 1 | 2.45 | 0.8 | 11.0 |
| Example 2 | | | 20.1 |
| Example 3 | | | 31.1 |
| Example 4 | | | 7.3 |
| Comparative Example 6 | | 1.8 | 50.7 |
| Comparative Example 7 | | | 23.5 |
| Comparative Example 8 | | | 26.0 |
| Comparative Example 9 | | | 29.5 |
| Comparative Example 10 | | | 34.1 |

As seen in the results in Table 2, it can be known that the reflection properties of a conductive structure body are low, in which a darkened pattern has a thickness from 20 nm to 60 nm, an average refractive index is from 2 to 3 in a visible light region, and an average extinction coefficient (k) is from 0.2 to 1.5 in a visible light region, and thus the concealment of the conductive pattern may be improved.

Experimental Example 5

Figure 7:
FIG. 7 illustrates the CIE L*a*b* color coordinate values and colors in Examples 1 and 2.
Figure 7:
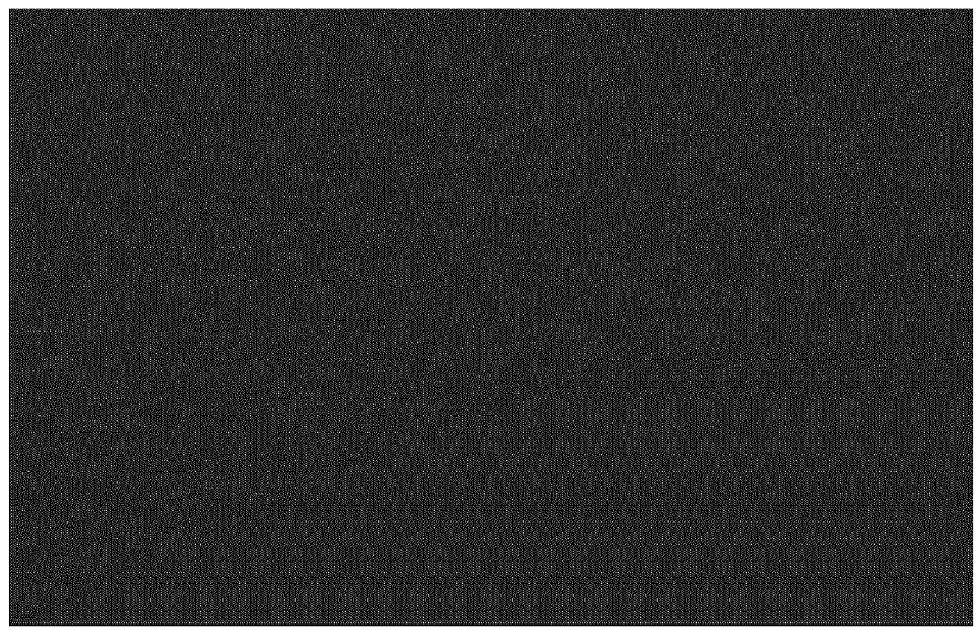

The CIE L*a*b* color coordinate value and color of Examples 1 and 2 were measured, and are shown in Table 2 and FIG. 7.

TABLE 3

| | L* | a* | b* |
|---|---|---|---|
| Example 1 | 19.88 | 33.02 | −22.19 |
| Example 2 | 47.20 | −7.82 | −10.97 |

Experimental Example 2

Under the same deposition condition, the deposition rates were compared between the case where a conductive layer was formed of Al and the case where a conductive layer was formed of Cu. The deposition criteria were DC 150 W, 3 m Torr 3'circle target.

TABLE 4

| Average deposition rate | Al | Cu |
|---|---|---|
| nm/min | 10 | 25 |

From the result of Table 4, it can be known that the case where a conductive layer is formed of Cu was advantageous in terms of a deposition rate and thus efficient in terms of a production process. The case of Cu is advantageous in that the improvement in productivity in the case of Cu is maximally 4 to 5 times higher than that in the case of Al. The specific resistance of Cu is 1.5 to 2 times better than that of Al, and thus the thickness thereof required to obtain the same sheet resistance becomes 1.5 to 2 times thinner than that of Al. Moreover, when the deposition rate obtained in Experiment Example 4 is reviewed, the deposition rate of Cu is 2.5 times better than that of Al. Therefore, Cu is capable of improving productivity by 4 to 5 times more than Al and thus is advantageous in that a relatively thin thickness may be formed at a rapid rate.

Thereafter, the deposition rate when a darkened layer was formed of AlNx ($0<x\leq1$) on a conductive layer comprising Al and the deposition rate when a darkened layer was formed of CuOx ($0<x\leq1$) on a conductive layer comprising Cu were compared. The deposition rate was calculated by dividing the thickness deposited for a predetermined time by the time. The deposition criteria of AlNx was DC 100 W, a reactive sputtering method was used, and the deposition criteria of CuOx ($0<x\leq1$) was RF 100 W.

TABLE 5

| Average deposition rate | AlNx | CuOx |
|---|---|---|
| nm/min | 0.7 | 1 |

From the result of Table 5, it can be known that the case where a darkened layer comprising CuOx ($0<x\leq1$) was formed was advantageous in terms of a deposition rate and thus efficient in terms of a production process.

The conductive structure body according to an exemplary embodiment of the present invention and a touch screen panel comprising the same may prevent reflection due to a conductive layer without affecting conductivity of the conductive layer by introducing a darkened layer comprising CuOx ($0<x\leq1$) into at least one surface of the conductive layer, and may improve the concealment of the conductive layer by improving the absorbance of the conductive structure body.

Furthermore, contrast properties of the touch screen panel may be further improved by introducing the above-described darkened layer. Further, the process of manufacturing a darkened layer comprising CuOx ($0<x\leq1$) is not limited, and is advantageous in that it is possible to perform collective etching with a universal aluminum etchant even in the etching process for fine electrode patterning.

In addition, the present invention may manufacture a conductive structure body comprising a conductive pattern having a line width of 10 μm or less by collectively etching the conductive layer and the darkened layer, which has been described above.

Those skilled in the art to which the present invention belongs can perform various applications and modifications within the scope of the present invention based on the contents.

Although the specific part of the present invention has been described in detail, it is obvious to those skilled in the art that such a specific description is just a preferred exemplary embodiment and the scope of the present invention is not limited thereby. Thus, the substantial scope of the present invention will be defined by the appended claims and equivalents thereof.

The invention claimed is:

1. A conductive structure body comprising:
a substrate;
a conductive pattern provided on the substrate; and
a darkened pattern provided on at least one surface of the conductive pattern and comprising $CuOx$ ($0<x\leq1$),
wherein the conductive pattern has a line width of 10 μm or less, the darkened pattern has a thickness from 35 nm to 50 nm, and the conductive structure body has an average refractive index from 2 to 3 and an average extinction coefficient (k) from 0.4 to 1.0 in the visible light region, and
wherein a total reflection of the darkened pattern is 20% or less, and
wherein the total reflection is a value measured based on a wavelength value of 550 nm in reflection light reflected by the darkened pattern or the conductive structure body to which light is incident when the incident light is defined as 100%.

2. The conductive structure body of claim 1, wherein the darkened pattern has a total reflection of 20% or less measured in a direction of a surface of the darkened pattern that is facing opposite to a surface of the darkened pattern facing toward the conductive pattern.

3. The conductive structure body of claim 1, wherein the darkened pattern is provided between the conductive pattern and the substrate and has a total reflection of 20% or less when measured through the substrate.

4. The conductive structure body of claim 1, wherein the conductive structure body has a sheet resistance from 1Ω/□ to 300Ω/□.

5. The conductive structure body of claim 1, wherein the conductive structure body has a brightness value (L*) of 50 or less based on the CIE L*a*b* color coordinate.

6. The conductive structure body of claim 1, wherein the darkened pattern additionally comprises one or more selected from the group consisting of a dielectric material and a metal.

7. The conductive structure body of claim 6, wherein the dielectric material is selected from the group consisting of $SiO$, $SiO_2$, $MgF_2$, and $SiNx$ (x is an integer of 1 or more).

8. The conductive structure body of claim 6, wherein the metal is selected from the group consisting of Fe, Co, Ti, V, Al, Au, and Ag.

9. The conductive structure body of claim 1, wherein the conductive pattern has a thickness from 0.01 μm to 10 μm.

10. The conductive structure body of claim 1, wherein the conductive pattern comprises one or more material selected from the group consisting of a metal, a metal alloy, a metal oxide, and a metal nitride, and the one or more material has a specific resistance from $1\times10^6$ Ω·cm to $30\times10^6$ Ω·cm.

11. The conductive structure body of claim 1, wherein the conductive pattern comprises one or more selected from the group consisting of copper, aluminum, silver, neodymium, molybdenum, nickel, an alloy thereof, an oxide thereof, and a nitride thereof.

12. The conductive structure body of claim 1, wherein the conductive pattern includes two surfaces and the darkened pattern is provided on both surfaces of the conductive pattern.

13. The conductive structure body of claim 1, wherein a line width of the darkened pattern is the same as or larger than a line width of the conductive pattern.

14. The conductive structure body of claim 13, wherein the darkened pattern has a pattern shape having a line width which is smaller or larger than a line width of the conductive pattern, and an area of the lines of the darkened pattern is 80% to 120% of an area of the lines of the conductive pattern.

15. A touch screen panel comprising the conductive structure body of claim 1.

16. A display device comprising the conductive structure body of claim 1.

17. A solar cell comprising the conductive structure body of claim 1.

18. A method for manufacturing a conductive structure body, the method comprising:
forming a conductive pattern having a line width of 10 μm or less on a substrate; and
forming a darkened pattern comprising $CuOx$ ($0<x\leq1$) in a thickness from 35 nm to 50 nm before, after, or before and after the conductive pattern is formed,
wherein the conductive structure body has an average refractive index from 2 to 3 and an average extinction coefficient (k) from 0.4 to 1.0 in the visible light region, and
wherein a total reflection of the darkened pattern is 20% or less, and
wherein the total reflection is a value measured based on a wavelength value of 550 nm in reflection light reflected by the darkened pattern or the conductive structure body to which light is incident when the incident light is defined as 100%.

19. A method for manufacturing a conductive structure body, the method comprising:
forming a conductive layer on a substrate;
forming a darkened layer comprising $CuOx$ ($0<x\leq1$) in a thickness from 35 nm to 50 nm before, after, or before and after the conductive layer is formed; and
forming a conductive pattern and a darkened pattern, which have a line width of 10 μm or less, by patterning the conductive layer and the darkened layer separately or simultaneously,
wherein the conductive structure body has an average refractive index from 2 to 3 and an average extinction coefficient (k) from 0.4 to 1.0 in the visible light region,
wherein a total reflection of the darkened pattern is 20% or less, and
wherein the total reflection is a value measured based on a wavelength value of 550 nm in reflection light reflected by the darkened pattern or the conductive structure body to which light is incident when the incident light is defined as 100%.

20. The method of claim 19, wherein the conductive layer or the darkened layer has a sheet resistance of more than 0Ω/□ and 2Ω/□ or less.

21. The method of claim 19, wherein the darkened pattern is formed using a sputtering method.

22. The method of claim 19, wherein the darkened layer is formed using a sputtering method.

* * * * *